United States Patent
Hwang et al.

(10) Patent No.: US 7,434,610 B2
(45) Date of Patent: Oct. 14, 2008

(54) HEAT DISSIPATION APPARATUS

(75) Inventors: Ching-Bai Hwang, Tu-Cheng (TW); Ran Lin, Shenzhen (CN); Jin-Gong Meng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 105 days.

(21) Appl. No.: 11/309,224

(22) Filed: Jul. 13, 2006

(65) Prior Publication Data

US 2008/0011460 A1    Jan. 17, 2008

(51) Int. Cl.
*H05K 7/20* (2006.01)

(52) U.S. Cl. .................. 165/80.3; 165/122; 361/697

(58) Field of Classification Search ............... 165/80.3, 165/122, 185; 361/697
See application file for complete search history.

(56) References Cited

U.S. PATENT DOCUMENTS

| | | | |
|---|---|---|---|
| 5,838,066 A * | 11/1998 | Kitajo | .................. 257/722 |
| 6,111,748 A | 8/2000 | Bhatia | |
| 6,333,852 B1 | 12/2001 | Lin | |
| 6,373,700 B1 | 4/2002 | Wang | |
| 6,421,239 B1 | 7/2002 | Huang | |
| 7,265,974 B2 * | 9/2007 | Lopatinsky et al. | ......... 361/697 |
| 2002/0172008 A1 * | 11/2002 | Michael | ................ 361/697 |
| 2003/0016497 A1 * | 1/2003 | Matsui et al. | ................ 361/695 |
| 2004/0245866 A1 * | 12/2004 | Lopatinsky et al. | ........... 310/64 |
| 2006/0078423 A1 * | 4/2006 | Zheng | .................. 415/206 |
| 2007/0029071 A1 * | 2/2007 | Hwang et al. | .......... 165/104.33 |

* cited by examiner

*Primary Examiner*—Allen J Flanigan
(74) *Attorney, Agent, or Firm*—Frank R. Niranjan

(57) ABSTRACT

A heat dissipation apparatus (10) includes a heat-dissipating fan (14) and a fin assembly (12). The heat-dissipating fan includes a casing (141) and a plurality of blades (142) rotatably received in the casing. The casing defines an air outlet (148) through which an airflow generated by the blades flows. The fin assembly is disposed at the air outlet of the fan, and includes a plurality of first fins (121) and a plurality of second fins (122) disposed between the first fins and the blades of the fan. The second fins are so positioned that outer ends of the second fins are oriented toward a far side of the air outlet while inner ends of the second fins are oriented toward a near side of the air outlet. The outer ends of the second fins are located adjacent to the first fins. An airflow generated by the blades first flows to the near side and then to the far side of the air outlet.

12 Claims, 3 Drawing Sheets

HEAT DISSIPATION APPARATUS

FIELD OF THE INVENTION

The present invention relates generally to a heat dissipation apparatus, and more particularly to a heat dissipation apparatus for dissipating heat generated by electronic components.

DESCRIPTION OF RELATED ART

Following the increase in computer processing power that has been seen in recent years, greater emphasis is now being laid on increasing the efficiency and effectiveness of heat dissipation devices. Referring to FIG. 3, a conventional heat dissipation apparatus 20 includes a heat-dissipating fan 22 and a fin assembly 24 disposed at an air outlet 221 of the heat-dissipating fan 22. The fin assembly 24 includes a plurality of fins 242 which thermally connect with a heat generating electronic component (not shown) to absorb heat therefrom. The heat-dissipating fan 22 includes a casing 222, a stator (not shown) mounted in the casing 222, and a rotor 223 rotatably disposed around the stator. When the heat-dissipating fan 22 is activated, the rotor 223 rotates in a counterclockwise direction around the stator, creating an airflow flowing through the fin assembly 24 in a manner so as to take away heat therefrom.

In operation of the heat dissipation apparatus 20, the casing 222 guides the airflow to move towards an upper side 246 of the air outlet 221 of the heat-dissipating fan 22. A portion of the airflow leaves the heat-dissipating fan 22 at the upper side 246 of the air outlet 221 with another portion flowing towards a bottom side 244 of the fin assembly 24 from the upper side 246 thereof. A flow direction of the airflow flowing toward the upper side 246 of the fin assembly 24 is substantially parallel to the fins 242 thereof, while the airflow flowing toward the bottom side 244 of the fin assembly 24 forms an acute angle with each fin 242 of the bottom side 244 of the fin assembly 24. The airflow flowing toward the bottom side 244 of the fin assembly 24 may be deflected by the fins 242 thereof due to the acute angles formed therebetween. This deflection of the airflow may cause a loss in kinetic energy of the airflow. Thus speed of the airflow flowing toward the bottom side 244 of the fin assembly 24 may be reduced. The heat dissipation efficiency of the heat dissipation apparatus 20 will thereby be further reduced. Accordingly, it can be seen that the heat dissipation efficiency of the heat dissipation apparatus 20 has room for improvement.

SUMMARY OF THE INVENTION

The present invention relates to a heat dissipation apparatus for dissipating heat generated by an electronic component. According to a preferred embodiment of the present invention, the heat dissipation apparatus includes a heat-dissipating fan and a fin assembly. The heat-dissipating fan includes a casing and a plurality of blades rotatably received in the casing. The casing defines an air outlet through which an airflow generated by the blades flows. The fin assembly is disposed in the air outlet of the fan, and includes a plurality of first fins and a plurality of second fins disposed between the first fins and the blades of the fan. The second fins, in relative to the first fins, are so rotated that outer ends of the second fins are moved toward a far side and inner ends of the second fins are moved toward a near side of the air outlet from which the airflow leaves the fan for guiding the airflow to flow more smoothly and evenly through the fin assembly. The airflow generated by the fan first flows to the near side and then to the far side.

Other advantages and novel features of the present invention will become more apparent from the following detailed description of preferred embodiment when taken in conjunction with the accompanying drawings, in which:

DETAILED DESCRIPTION OF THE INVENTION

Figure 1:
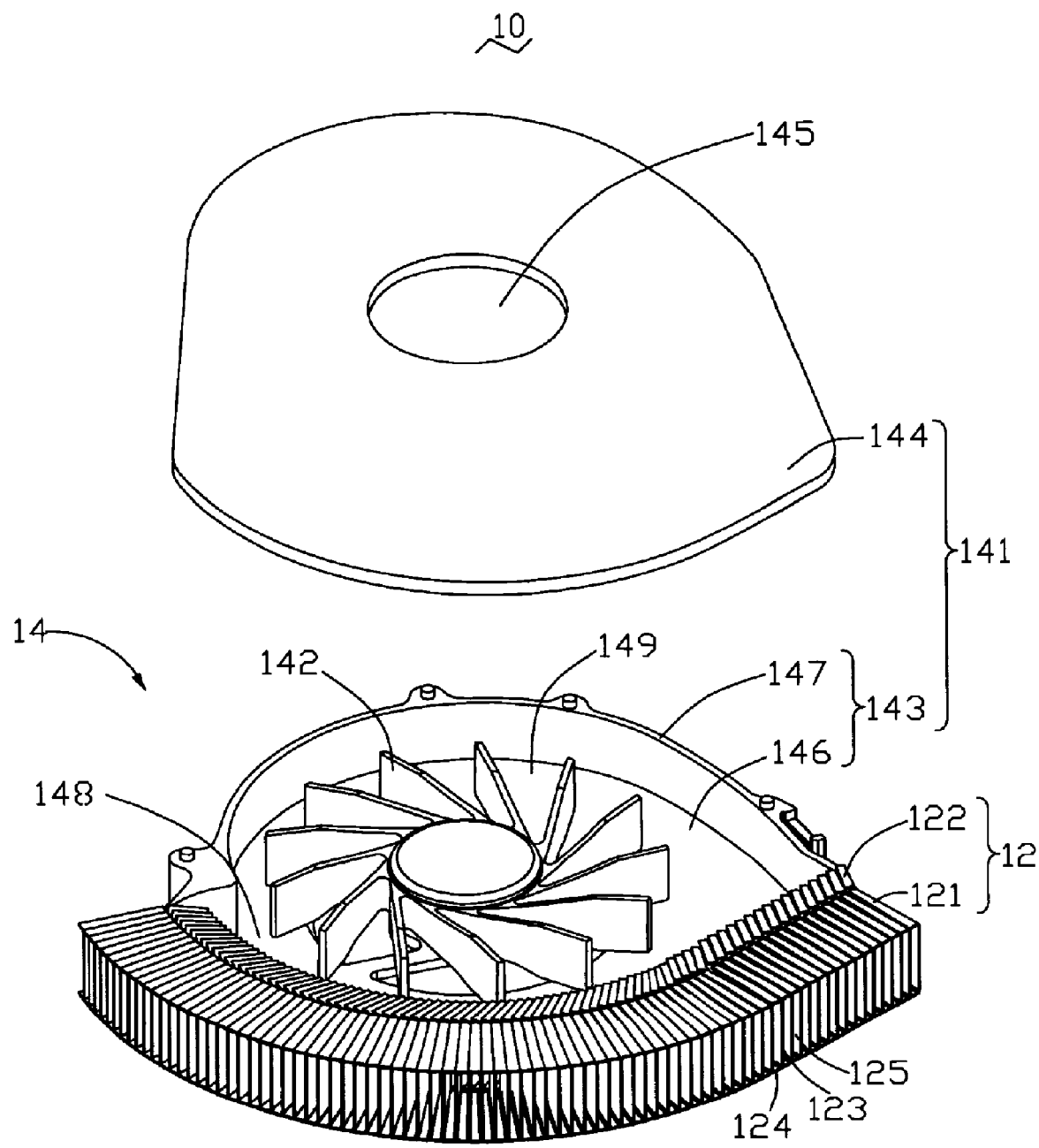
FIG. 1 is an exploded, isometric view of a heat dissipation apparatus according to a preferred embodiment of the present invention.

Referring to FIG. 1, a heat dissipation apparatus 10 according to a preferred embodiment of the present invention is shown. The heat dissipation apparatus 10 includes a fin assembly 12 thermally connected with a heat-generating electronic component (not shown) to absorb heat therefrom, and a heat-dissipating fan 14 for providing an airflow flowing through the fin assembly 12 to take the heat away.

The heat-dissipating fan 14 is a centrifugal blower which enables the airflow to have a high air pressure. The heat-dissipating fan 14 includes a casing 141, a stator (not shown) mounted in the casing 141, and a rotor including a plurality of blades 142 rotatably disposed around the stator.

Figure 2:
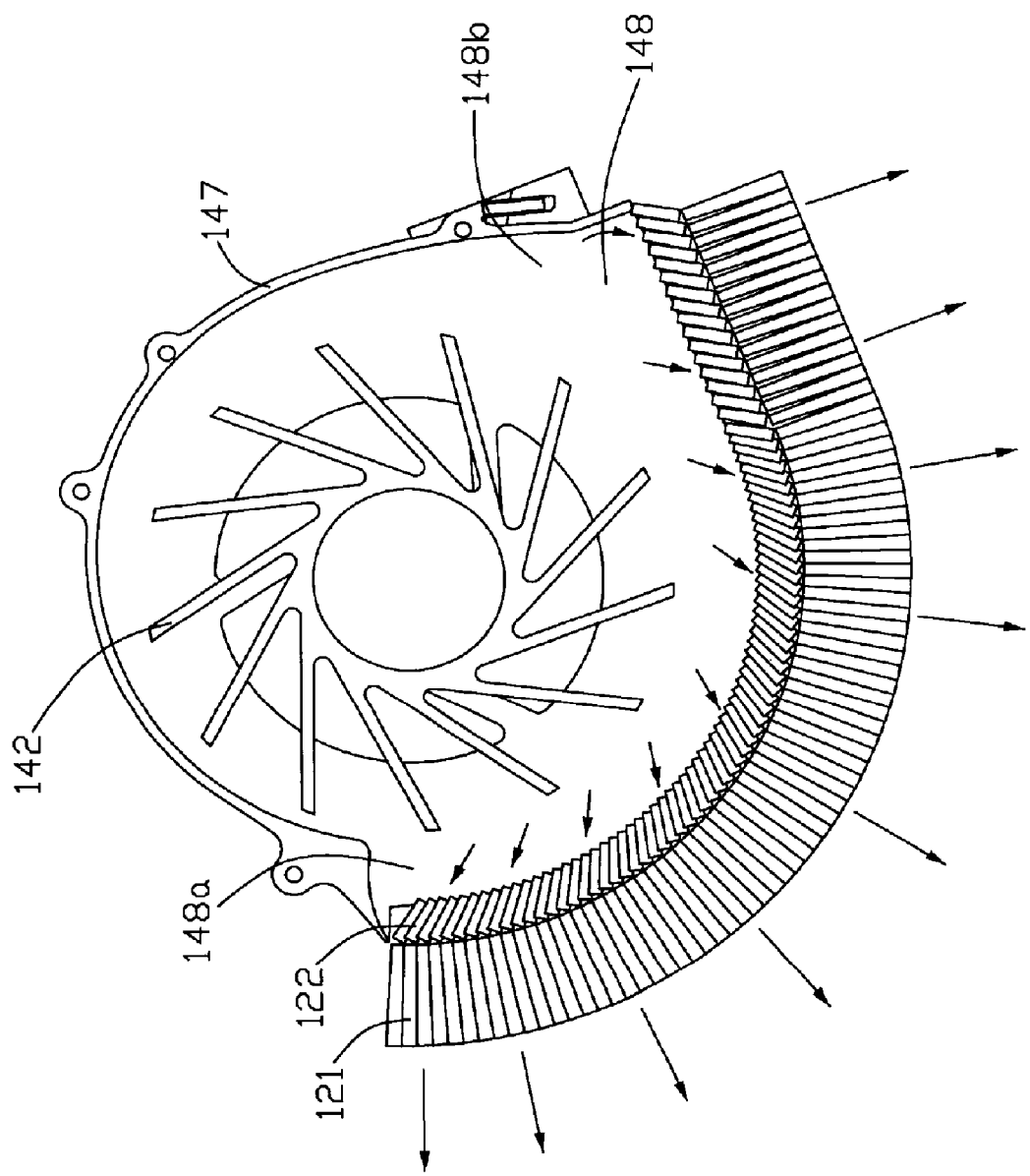
FIG. 2 is a top view of the heat dissipation apparatus of FIG. 1, with a top cover thereof removed.

The casing 141 includes a bottom housing 143 and a top cover 144 mounted on the bottom housing 143. The top cover 144 is a plate, which defines a through hole therein functioning as an air inlet 145 for the heat-dissipating fan 14. The bottom housing 143 includes a flattened base 146, and an arc-shaped sidewall 147 perpendicular to the top cover 144 and the base 146 of the bottom housing 143. The sidewall 147 of the bottom housing 143 defines an arc-shaped opening therein functioning as an air outlet 148 for the heat-dissipating fan 14. An air channel 149 is formed between free ends of the blades 142 and an inner surface of the sidewall 147 of the bottom housing 143. A width of the air channel 149 is gradually increased along a clockwise direction as viewed from FIG. 2 so as to increase the pressure of the airflow, wherein the blades 142 rotate clockwise. In operation of the heat-dissipating fan 14, the airflow is driven to first flow to a right side 148b of the air outlet 148 and then to a left side 148a thereof, whereby the airflow leaves the air outlet 148 and the fin assembly 12 to take heat away from the fin assembly 12.

Figure 3:
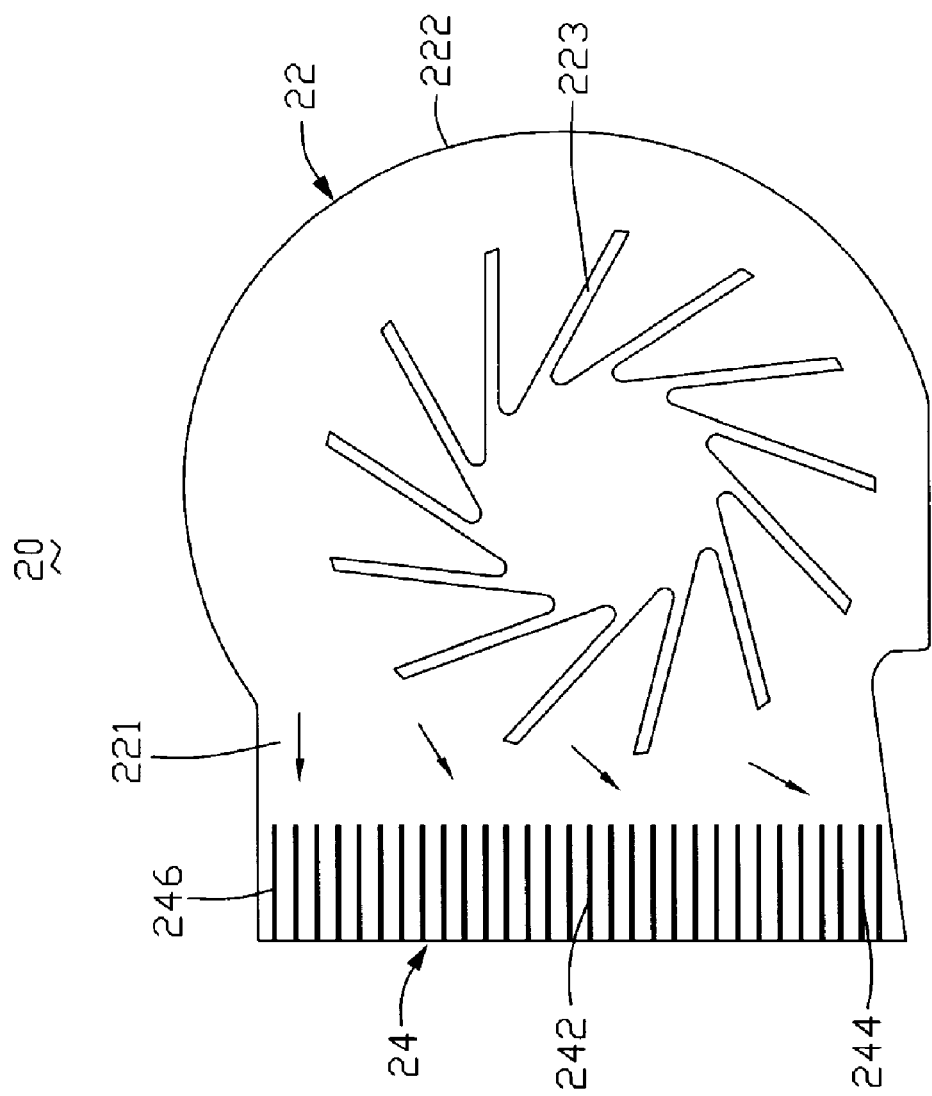
FIG. 3 is a top view of a conventional heat dissipation apparatus with some parts thereof removed.

The fin assembly 12 is arc-shaped in profile to match with the air outlet 148 of the heat-dissipating fan 14. The fin assembly 12 includes a plurality of outer and medium fins 121, 122. Each of the outer and medium fins 121, 122 includes a main body 123, and two flanges 124 perpendicularly extending from two opposite ends of the main body 123. The outer fins 121 are disposed at an outer edge of the air outlet 148 of the heat-dissipating fan 14 and around a rotational axis of the rotor. The outer fins 121 are so oriented that they are generally pointed toward the rotational axis of the rotor. The medium fins 122 are located between the outer fins 121 and the blades 142 of the heat-dissipating fan 14, with outer ends (air outtakes) thereof contacting with inner ends of the outer fins 121. The medium fins 122, in relative to the outer fins 121, are rotated with an angle so that the outer ends of the medium fins 122 are moved towards the left side 148a of the air outlet 148 while inner ends (air intakes) of the medium fins 122 are moved toward the right side 148b. The main bodies 123 of each of the outer and medium fins 121, 122 are linear shaped as viewed from FIG. 2, and separately form larger and smaller acute angles with the flow direction of the airflow flowing toward the fin assembly 12. A plurality of air passages 125 are formed between adjacent fins 121, 122, with a linear-shaped portion formed between two adjacent medium fins 122 facing to the airflow flowing theretoward. During the airflow flowing through the air passages 125 of the fin assembly 12, the flow direction of the airflow is slightly changed to a direction parallel to the main bodies 123 of the medium fins 122, and then is further changed to a direction parallel to the main bodies 123 of the outer fins 121. The flow direction of the airflow is thus gradually and smoothly changed to a direction parallel to the main bodies 123 of the outer fins 121, which makes the airflow flow evenly through the air passages 125 of the fin assembly 12, without being fiercely deflected by the fins 242 of the fin assembly 24 of the conventional heat dissipation apparatus 20 of FIG. 3.

In the present invention, the main bodies 123 of the medium fins 122 of the fin assembly 12 form smaller angles with the flow direction flowing toward the fin assembly 12. The flow direction of the airflow is gradually and smoothly changed to a direction parallel to the main bodies 123 of the outer fins 121. This makes the airflow flow evenly through the air passages 125 of the fin assembly 12. So the airflow arriving at the fin assembly 12 can not be fiercely deflected by the outer and medium fins 121, 122 of the fin assembly 12. The kinetic energy loss from the airflow is thus prevented and the heat dissipation efficiency of the heat dissipation apparatus 10 is thereby increased.

In the present invention, the fin assembly 12 consists of two kinds of fins, i.e. the outer fins 121 and the medium fins 122, with acute angles formed between each kind of the fins and the flow direction of the airflow flowing toward the fin assembly 12 increasing from an inner side of the air outlet 148 towards the outer side thereof. Alternatively, the fin assembly may consist of more than two kinds of fins, with acute angles formed between each kind of the fins and the flow direction gradually increasing from an inner side of the air outlet toward outer side thereof.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation apparatus comprising:
a heat-dissipating fan comprising a casing and a plurality of blades rotatably received in the casing, the casing defining an air outlet through which an airflow generated by the blades flows, the air outlet having a near side and a far side, the airflow first reaching the near side and then the far side; and
a fin assembly disposed at the air outlet of the fan, and comprising a plurality of first fins and a plurality of second fins disposed between the first fins and the blades of the fan, the second fins, relative to the first fins, being rotated with an angle that outer ends of the second fins which are adjacent to the first fins are moved toward the far side while inner ends of the second fins are moved toward the near side;
wherein the outer ends of the second fins contact with inner ends of the first fins.

2. The heat dissipation apparatus as described in claim 1, wherein the casing further defines an air inlet perpendicular to the air outlet.

3. The heat dissipation apparatus as described in claim 2, wherein the air inlet is defined in a top wall of the casing, whilst the air outlet is defined in a sidewall of the casing.

4. The heat dissipation apparatus as described in claim 3, wherein the sidewall of the casing is arc-shaped in profile.

5. The heat dissipation apparatus as described in claim 1, wherein the air outlet is arc-shaped in profile.

6. The heat dissipation apparatus as described in claim 1, wherein the first fins are linear shaped in profile.

7. The heat dissipation apparatus as described in claim 1, wherein the second fins are linear shaped in profile.

8. The heat dissipation apparatus as described in claim 1, wherein the heat-dissipating fan is a centrifugal blower.

9. A heat dissipation apparatus comprising:
a heat-dissipating fan comprising a casing and a plurality of blades rotatably received in the casing for providing an airflow, the casing defining an air inlet and an air outlet therein, the air outlet having a near side and a far side, an airflow generated by the fan first flowing to the near side and then to the far side; and
a fin assembly comprising a plurality of air passages allowing the airflow to flow through, each of the air passages comprising a first linear-shaped portion and a second linear-shaped portion, the first linear-shaped portion being disposed more adjacent to the blades than the second linear-shaped portion, having an orientation different from that of the second linear-shaped portion and being so oriented that an air intake thereof is pointed toward the near side while an air outtake thereof is pointed toward the far side of the air outlet;
wherein the fin assembly comprises a plurality of first and second fins, the first linear-shaped portion of each of the air passages is formed between two adjacent second fins; and
wherein each of the second fins contacts with a corresponding first fin at an end distant from the blades.

10. The heat dissipation apparatus as described in claim 9, wherein the first fins are disposed distant from the blades and each are linear shaped in profile.

11. The heat dissipation apparatus as described in claim 9, wherein the air inlet is defined in a top wall of the casing, whilst the air outlet is defined in a sidewall perpendicular to the top wall of the casing.

12. The heat dissipation apparatus described in claim 9, wherein the heat-dissipating fan is a centrifugal blower.

* * * * *